| United States Patent [19] | [11] Patent Number: 4,902,376 |
| Chen et al. | [45] Date of Patent: Feb. 20, 1990 |

[54] MODIFIED HORIZONTAL BRIDGMAN METHOD FOR GROWING GAAS SINGLE CRYSTAL

[75] Inventors: Tzer-Perng Chen; Yih-Der Guo, both of Hsinchu; Tsun-Tsai Chang, Taichung, all of Taiwan

[73] Assignee: Industrial Technology Research Institute, Hsinchu, Taiwan

[21] Appl. No.: 290,994

[22] Filed: Dec. 28, 1988

[51] Int. Cl.⁴ ............ C30B 11/04; C30B 29/40; C30B 29/42; C30B 29/44
[52] U.S. Cl. .................. 156/616.2; 156/620.2; 156/DIG. 70; 156/DIG. 89; 156/DIG. 81
[58] Field of Search ......... 156/616.2, 620.2, DIG. 70, 156/DIG. 89, DIG. 81

[56] References Cited

U.S. PATENT DOCUMENTS

| 3,481,711 | 12/1969 | Maruyama | 156/620.2 |
| 3,520,810 | 7/1970 | Plaskett et al. | 156/616.2 |
| 3,623,905 | 11/1971 | Akai et al. | 156/DIG. 70 |
| 3,690,847 | 9/1972 | Merkel et al. | 156/616.2 |
| 3,767,473 | 10/1973 | Ayel et al. | 156/616.2 |
| 3,877,883 | 4/1975 | Berkman et al. | 156/DIG. 70 |

*Primary Examiner*—Gary P. Straub
*Assistant Examiner*—M. Franklin
*Attorney, Agent, or Firm*—Ladas & Parry

[57] ABSTRACT

A process for growing a gallium arsenide single crystal from a polycrystalline gallium arsenide by the horizontal Bridgman technique includes (a) melting the polycrystalline gallium arsenide in a quartz boat which is placed in a quartz tube, at a temperature greater than 1238 deg C. but lower than the melting point of quartz, (b) decreasing the temperature of the melt of gallium arsenide from the seed/melt interface by moving a furnace to crystallize the melt, and (c) annealing the crystallized gallium arsenide during the crystal growth process at a temperature of 1100–1220 deg C.; wherein the above steps are carried out in the absence of an As vapor pressure controlling zone which is kept at a temperature of about 617 deg C. Due to the anealing step, the thermal stress is small and the dislocation hardly occurs. A short quartz tube can be employed due to the absence of the As zone.

2 Claims, 2 Drawing Sheets

MODIFIED HORIZONTAL BRIDGMAN METHOD FOR GROWING GAAS SINGLE CRYSTAL

BACKGROUND OF THE INVENTION

This invention relates to a process for growing a gallium arsenide single crystal, and particularly to a modified Horizontal Bridgman Method in which no low temperature arsenic zone is provided.

Gallium arsenide (GaAs) is a direct band gap semiconductor and has a high radiative recombination efficiency. GaAs wafers have been used as substrates for a lot of optoelectronic devices such as infrared LEDs, solar cells, laser diodes and optoelectronic integrated circuits (OEIC). The requirements of most of the optoelectronic devices for GaAs substrates are low etch pit density and high doping concentration without microdefect.

Conventional boat growth methods for growing GaAs single crystals such as a two temperature zone horizontal Bridgman (2T-HB) method, gradient freeze (GF) method and three temperature zone horizontal Bridgmen (3T-HB) method are illustrated in FIG. 1. In the 2T-HB method, GaAs polycrystalline is introduced into a quartz boat which is placed in the high temperature zone of a quartz tube, and arsenic is placed in a low temperature zone of the quartz tube. The high temperature zone is kept at a temperature higher than the melting temperature Tf (1238 deg C.) of GaAs and the low temperature (T3) is kept within in a range of 610–617 deg C. After the GaAs is melted, it is cooled from the seed end to start the crystal growth by moving the furnace. The stoichiometry of the GaAs crystal is maintained by controlling the As zone temperature (T3) such that the vapor pressure of As equals to the dissociation pressure of the GaAs melt. In the gradient freeze method, the only difference is that the high temperature zone has a small slope from the seed end to the tail end and the crystal growth of GaAs takes place by the movement of the temperature gradient along the boat. Both the 2T-HB method and the gradient freeze method have the following disadvantages:

(1) The crystal is susceptible to dislocation generation due to thermal stress caused upon cooling from the high temperature zone to the low temperature zone without any intermediate annealing zone; and (2) The GaAs crystal is liable to stick to the quartz boat and it is difficult to obtain a high purity single crystal because of the reasons described hereinbelow.

The GaAs melt and the quartz boat can induce the following reactions,

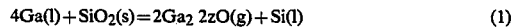

$$4Ga(l) + SiO_2(s) = 2Ga_2 2zO(g) + Si(l) \quad (1)$$

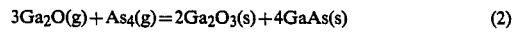

$$3Ga_2O(g) + As_4(g) = 2Ga_2O_3(s) + 4GaAs(s) \quad (2)$$

The reaction between the Ga and the quartz boat generates $Ga_2O$ vapor and liberates Si into the GaAs melt. The $Ga_2O$ vapor then diffuses away from the melt to the colder parts of the ampoule. At the colder part, $Ga_2O$ vapor reacts with $As_4$ vapor and condenses as $Ga_2O_3$ and GaAs solids. This causes a deficiency in the $Ga_2O_3$ vapor and makes the equation (1) continue to progress to the right-hand side. Thus, the more Ga reacts with the quartz boat, the more serious the sticking between GaAs ingot and quartz boat. Growth of the high purity GaAs is therefore impossible due to a large amount of Si incorporated into the GaAs melt.

The 2T-HB method is modified by the 3T-HB method in which an intermediate annealing zone (T2) of 1100–1200 deg C. is provided to alleviate the problem of thermal stress and a diffusion barrier is provided between the high temperature melting zone and the annealing zone. This diffusion barrier serves to retard the diffusion of $Ga_2O$ vapor and thus a saturation vapor pressure of $Ga_2O$ can be maintained in the high temperature zone. The reaction of equation (1) is nearly ceased after a saturation vapor pressure of $Ga_2O$ being established and the sticking between the GaAs ingot and the quartz boat can be prevented. Although the 3T-HB method is more advantageous than the 2T-HB method and the GF method, it requires a relatively long furnace. For instance, for growing a GaAs single crystal of 50 cm, the furnace must be 3 meters long and the length of the ceramic supporting tube must be greater than 3.5 meter. Furthermore, a complicated furnace design is necessary to control the temperature changes in the 50 cm long As zone to within 1 deg C.

SUMMARY OF THE INVENTION

An object of the present invention is to provide a modified 2T-HB method which overcomes the disadvantages mentioned hereinbefore.

In the M2T-HB method according to the present invention, the system has a high temperature zone and an annealing temperature zone. The arsenic vapor pressure controlling zone which is kept at a temperature approximately 617 deg C. is omitted so that a short quartz ampoule, which is just long enough for sealing off the boat, can be used. With a short ampoule and a large charge of polycrystalline GaAS, the arsenic loss due to the dissociation of the melt is very small.

According to the present invention, a process for growing a gallium arsenide single crystal from a polycrystalline gallium arsenide by the horizontal Bridgman technique comprises: (a) melting the polycrystalline gallium arsenide in a quartz boat which is placed in a quartz tube, at a temperature greater than 1238 deg C. but lower than the softening point of quartz; (b) decreasing the temperature of the melt of GaAs from the seed/melt interface by moving the furnace to cause the melt to be crystallized; and (b) annealing the crystallized gallium arsenide during the crystal growth process at a temperature of 1100–1220° C.; wherein the above steps carried out in the absence of an As vapor pressure controlling zone which is kept at a temperature of about 617° C. Certainly, the process may further comprise the step of introducing a small amount of As into the quartz tube before sealing the quartz tube. The quartz tube employed may have a length substantially similar to that of the quartz boat.

In the present invention, due to the use of a short quartz ampoule, there is no cold parts in which $Ga_2O$ vapor condenses. Once the $Ga_2O$ vapor pressure generated by the reaction between the GaAs melt and the quartz boat equals to the saturation pressure, the reaction of the equation (1) is self-limited. Since the Si contamination from the quartz boat is also greatly reduced, it is believed that this method has a potential for growing high purity GaAs crystals, for example, the undoped semi-insulating GaAs.

In addition, since there are only two temperature zones, the design of the furnace required in the present invention is simplified, and the control of the temperature gradient at the interface between the solid and liquid is facilitated.

The present invention also employs a furnace having a quartz window for inspecting the situation of the growth of the crystal, such as the shape of the growing interface of the crystal, the formation of a single crystal, or polycrystal, as well as for adjusting the temperature distribution along the axial and radial directions by varying the size and thickness of the quartz window.

The present exemplary preferred embodiment will be described in detail with reference to the, accompanying drawings:

BRIEF DESCRIPTION OF THE DRAWINGS

FIG. 1 illustrates three conventional boat growth methods in which

DETAILED DESCRIPTION OF THE PREFERRED EMBODIMENT

Figure 2:
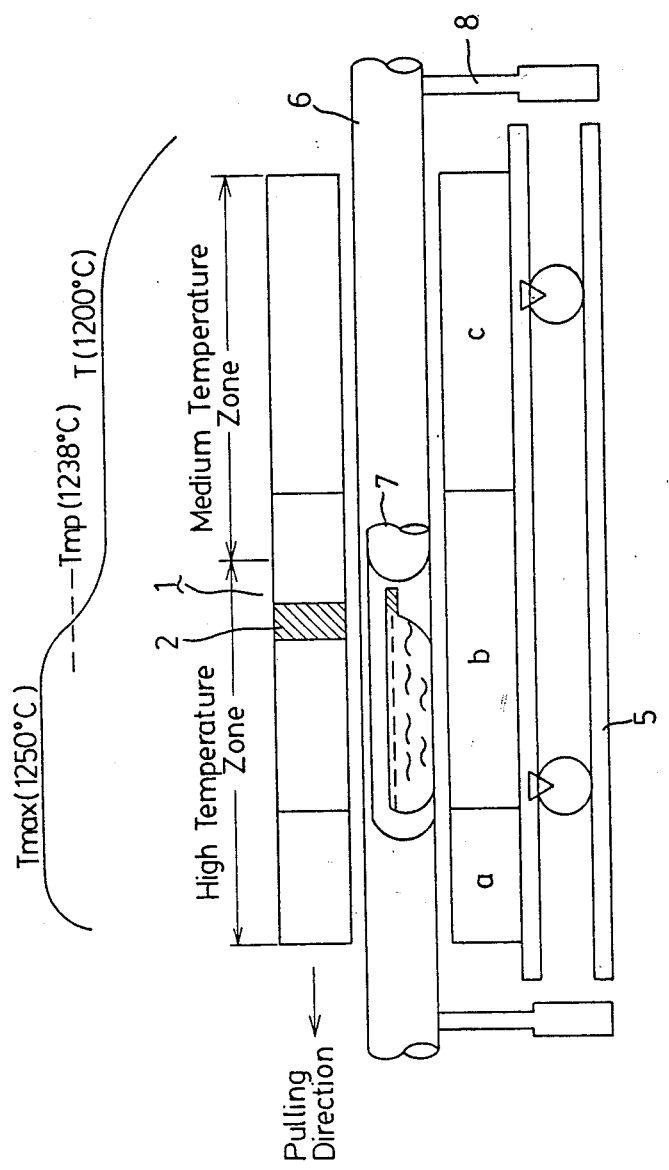
FIG. 2 is a schematic view showing an apparatus used in the present invention.

FIG. 2 shows schematically an apparatus used in the present invention in which some conventional parts are omitted for simplification. As shown in FIG. 2, the apparatus used in the present invention comprises a furnace 1 which has a high temperature melting zone and a medium temperature annealing zone. The high temperature zone has a temperature higher than the melting temperature of GaAs (1238 deg C.), but lower than 1250 deg C. so as to avoid the softening of the quartz tube. The medium temperature annealing zone has a temperature of 1100-1220 deg C. Each temperature zone is constituted of two to three small furnaces as required according to the length of the grown single crystal. A quartz window 2 is provided at the high temperature zone for the purposes of inspecting the growth of the crystal. The location of the quartz window 2 should be away from the heating element of the furnace and adjacent to the shell of the furnace so as to decrease the extent of the devitrification. The thickness of the quartz window must be large enough to prevent heat loss by conduction. However, radient heat loss still can occur. By varying the size and thickness of the quartz window; the solid liquid interface of the growing crystal can be controlled so as to obtain a GaAs single crystal with a low dislocation density.

The furnace is placed on a platform and can be moved on a rail 5 by means of a driving mechanism 4 at different speeds. The low speed is controlled to between 1 mm-5 mm/hr and the high speed can be controlled to between 1 cm-5 cm/hr.

A ceramic tube 6 is supported by struts 8 and is extended longitudinally through the furnace 1. A sealed quartz ampoule 7 containing a quartz boat and polycrystalline GaAs is positioned in the ceramic tube 6. The ceramic tube 6 is provided with an oblong hole in alignment with the quartz window 2 of the furnace 1. The ceramic tube 6 may be made of aluminum oxide or silicon carbide which exhibits more efficient conduction and more strength. The whole assembly of the furnace, ceramic tube and the struts is provided on an inclined surface of a table and covered by a housing (not shown). The slope of the inclined surface may be between 0-15 degs. The temperature of the furnace is controlled by a temperature control device (not shown), The axial temperature gradient along the interface of the growing crystal is controlled at 2-5 deg C./cm. A reflective mirror or a camera (not shown) is provided adjacent to the quartz window for the purpose of inspecting the condition of the crystal growth.

The interior of the quartz boat has an inner diameter of about 5.04 cm (2 inches) and a length of about 30 cm. The length of the quartz tube 7 is substantially similar to that of the quartz boat and is shorter that of the quartz tube which are used in the above-mentioned conventional methods. The quartz boat occupies about 50% of the total interior volume of the quartz tube.

Figure 1A:
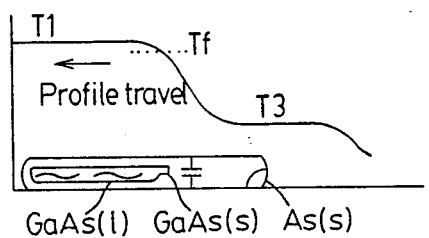
FIG. 1*a*shows the temperature profile of a two temperature hosizonal Bridgeman (2T-HB) method.
Figure 1B:
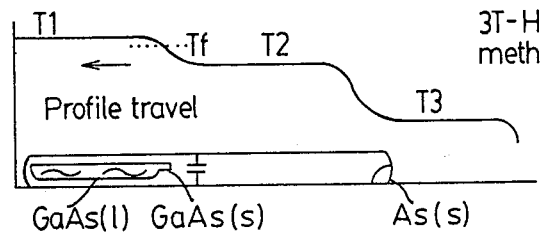
FIG. 1*b* shows the temperature profile of three temperature horizonal Bridgeman (3T-HB) method and FIG. 1*c* shows the temperature profile of a gradient freeze (GF)method.
Figure 1C:
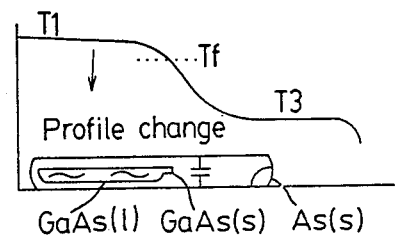
Figure 3:
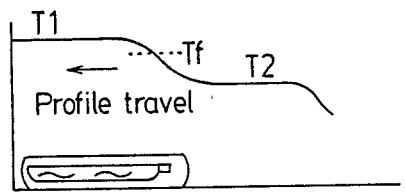
FIG. 3 illustrates the profile of the temperature distribution in the process according to the present invention.

1.4 kg of polycrystalline GaAs, a seed and a small amount of As are put in the quartz boat, and the quart tube 7 is evacuated. After a vacuum of about $1 \times 10^{-6}$ Torr is reached, the quartz tube 7 is sealed. Then, the sealed tube 7 is positioned in the furnace and the GaAs is melted at the high temperature zone. After thermal equilibrium is maintained for a period of time, the furnace is moved along the boat with a rate of 3 mm/hr to crystallize the melt and anneal the crystallized GaAs at 1100°-1220° C. Then, the annealed GaAs is cooled firstly to 800 deg C. at a cooling rate of 10-30 deg C. per hour and finally to room temperature at a rate of about 80 deg C. per hour. The temperature profile of the furnace is shown in FIG. 3. The single crystal obtained has a weight of 1.4 kg, a diameter of 2 inches and a length of 30 cm. The orientation of the crystal is (111). The disclocation density is smaller than 3000 cm. No sticking occurs between the crystal and the quart boat.

For most commercial crystal growth systems, it is not easy to maintain the As zone temperature variation at less than 0.5 deg C. as this temperature fluctuation will result in a variation of the melt stoichiometry. The composition and the total As vapor pressure data along the GaAs liquidus line were calculated and listed in Table 1. This data was calculated according to the following equations.

$$\alpha = -\frac{RT\ln 4 X_{As}(1 - X_{As}) + \Delta S^F(T^F - T)}{2(0.5 - X_{As})^2} \quad (1)$$

$$\alpha = 5160 - 9.16T \quad (2)$$

$$\log P^*_{As2} = 7.095 - \frac{9235}{T} \text{ (atm)} \quad (3)$$

$$\alpha = \frac{RT\ln\{(P_{As2}/P^*_{As2})^{1/2}/X_{As}\}}{(1 - X_{As})^2} \quad (4)$$

$$\log [P_{As4}/(P_{As2})^2] = -7.54 + \frac{11547}{T} \quad (5)$$

$$P_{total} = P_{As4} + P_{As2} \quad (6)$$

where $X_{As}$ is the mole fraction of As, $\Delta S^F = 16.64$ cal/mole.K is the entropy of fusion of GaAs, $T^F = 1238$ deg C. is the melting temperature and $\alpha$ is the interaction parameter.

The total As vapor pressure resulting from the evaporation of the solid As was calculated according to the following equation, $$\log P_{total} = 7.91 - \frac{7000}{T} \text{ (atm)}$$

which was obtained by fitting the data of Boomgaard et al. The results are listed in Table 2. From the two above tables, it is clear that a 0.5 deg C. temperature variation of the As zone will induce about 0.07 at.% change in the stoichiometry of the melt.

In the M2T-HB method, because there is no solid. As source, the As vapor must come from the dissociation of the GaAs melt. The dissociation of the GaAs melt will continue until an equilibrium As vapor pressure is built up. The loss of As from the melt can be estimated assuming the ideal gas law, PV=nRT. Based on our experimental conditions, assumptions were used for the calculation:

(1) Polycrystalline GaAs charge is 2 kg.
(2) The volume of the quartz ampoule is 750 c.c.
(3) The temperature in the high temperature zone is 1250 deg C. and the dissociation vapor pressure of GaAs melt is about 850 torr (1).
(4) All the arsenic vapor is $As_4$.

Using the above assumptions, the maximum stoichiometry change of the melt is calculated to be about 0.05 at. % in the M2T-HB method and is better than those of the controlled As zone method.

In view of the above fact, it can be appreciated that the melt stoichiometry of the present invention can be controlled more easily than in the conventional methods so that the possibility of obtaining a high quality GaAs single crystal is increased in the present invention.

Although no As is provided in the quartz tube in this embodiment, the invention is not limited thereto. A small amount of arsenic which is calculated according to the ideal gas law can be provided in the quartz tube for maintaining a saturated arsenic vapor pressure in the quartz tube.

When compared with the above-mentioned conventional methods, the present invention has the following advantages:

(1) The process of the present invention is simple and decreases the production cost since there is no As zone.
(2) The problem of sticking between the crystal and the quartz boat is eliminated, and the possibility of obtaining a high quality GaAs single crystal is increased.
(3) The growth of the crystal can be observed and controlled by means of the quartz window.
(4) The furnace system used in the present invention is simplified and can be constructed at a reduced cost.
(5) The stoichiometry of the melt can be controlled easily.
(6) A high purity single crystal can be obtained easily since there is less Si contamination.

What I claim is:

1. A process for growing a gallium arsenide single crystal from a polycrystalline gallium arsenide by the horizontal Bridgman technique comprising:
    (a) melting the polycrystalline gallium arsenide in a quartz boat which contains a seed and which is placed in a sealed quartz tube heated by a furnace, at a temperature greater than 1238 deg C. but lower than the melting point of quartz;
    (b) cooling the melt from the seed end to start the crystal growing by moving the furnace; and
    (c) annealing the crystallized gallium arsenide during the crystal growth process at a temperature of 1100–1220 deg C.;
    (d) cooling the annealled gallium arsenide to room temperature;

wherein said steps are carried out in the absence of a separate As vapor pressure controlling zone additionally comprising the step of introducing a small amount of arsenic into said quartz tube before sealing the quartz tube to maintain the stoichiometric composition. Said amount of arsenic being equal to that calculated by the ideal gas law as being lost by dissociation of GaAs at its melting point.

2. A process as claimed in claim 1, wherein said quartz tube has a length and diameter just sufficient to enclose said quartz boat.

* * * * *